(12) United States Patent
Liedenbaum

(10) Patent No.: US 7,038,376 B2
(45) Date of Patent: May 2, 2006

(54) DEVICE, PARTICULARLY AN ELECTROLUMINESCENT DISPLAY DEVICE, AND METHOD OF MANUFACTURING SUCH A DEVICE

(75) Inventor: Coen Theodorus Hubertus Fransiscus Liedenbaum, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 389 days.

(21) Appl. No.: 10/023,161

(22) Filed: Dec. 18, 2001

(65) Prior Publication Data

US 2002/0074931 A1 Jun. 20, 2002

(30) Foreign Application Priority Data

Dec. 20, 2000 (EP) .................................. 00204653

(51) Int. Cl.
*H05B 33/04* (2006.01)
(52) U.S. Cl. ....................... 313/512; 349/153
(58) Field of Classification Search ................ 313/498, 313/506, 512, 493; 349/153
See application file for complete search history.

(56) References Cited

U.S. PATENT DOCUMENTS 3,926,502 A * 12/1975 Tanaka et al. .............. 349/154
3,990,782 A * 11/1976 Yamasaki ................... 349/154
5,239,228 A * 8/1993 Taniguchi et al. .......... 313/512
6,293,843 B1 * 9/2001 Toya et al. .................. 445/25

FOREIGN PATENT DOCUMENTS

| EP | 0350907 A2 | | 1/1990 |
| JP | 63131494 | | 3/1988 |
| JP | 10242315 A | * | 9/1998 |
| JP | 2000-100562 | * | 4/2000 |

OTHER PUBLICATIONS

Patent Abstracts of Japan, Sakai Horihiro, "Organic El Element And Its Manufacture," Publication No. 2000100562, Apr. 7, 2000, Application No. 10268489, filed Sep. 22, 1998.
Patent Abstracts of Japan, Ota Kazuhide, "Organic El Element Sealing Method," Publication No. 2001155854, Jun. 8, 2001, Application No. 11332644, Nov. 24, 1999.

* cited by examiner

*Primary Examiner*—Karabi Guharay
(74) *Attorney, Agent, or Firm*—Michael E. Belk

(57) ABSTRACT

A device, particularly an electroluminescent display device, is disclosed in which two or more parts which define a cavity for accommodating one or more components, such as an electroluminescent element; are present. The parts are sealed together by means of a thermosetting adhesive present at the interface of the two or more parts. At least one channel is provided in the interface which is open to the cavity.

16 Claims, 3 Drawing Sheets

DEVICE, PARTICULARLY AN ELECTROLUMINESCENT DISPLAY DEVICE, AND METHOD OF MANUFACTURING SUCH A DEVICE

The invention relates to a device, particularly an electroluminescent (EL) display device, comprising two or more parts which define a cavity for accommodating one or more components, such as an EL element, and which are sealed together by means of a thermosetting adhesive present at the interface of the two or more parts. The invention also relates to a method of manufacturing said device, the method at least comprising the steps of applying a thermosetting adhesive to the interface of at least one of the parts, bringing the parts together and thus forming a cavity (for) accommodating one or more components such as an electroluminescent element, and heating the device so as to cure the thermosetting adhesive.

An EL display device emits light when the device is suitably connected to a power supply. If the light emission originates in an organic material, said device is referred to as an organic EL device. An (organic) EL device can be used, inter alia, as a thin light source having a large luminous surface area, such as a backlight for a liquid crystal display (LCD) or a watch. An (organic) EL device can also be used as a display if the EL device comprises a (large) number of EL elements, which may or may not be independently addressable.

A device of the type mentioned in the opening paragraph is disclosed in European patent application EP 0 350 907 A2. This publication describes (in conjunction with FIG. 2) a conventional thin film EL panel which is prepared by forming, on a glass base plate (2), a lower transparent electrode (3), a lower insulating layer (4), a luminescent layer (5), an upper insulating layer (6) and an upper electrode (7), in this order. The constitution of the layers (3 to 7) is called an EL element (1). In order to prevent moisture from reaching the EL element, it is covered by a glass cover (8) which is adhered to the glass base plate (2) by a thermosetting adhesive, such as an epoxy. By heating the entire assembly to a temperature typically in the range of e.g. from 80 to 130° C. during 45 to 5 minutes, respectively, the epoxy is cured and the cover is sealed onto the glass plate.

During this process, the viscosity of the adhesive initially decreases to a level that allows it to flow over the substrate. At the same time, the pressure of the gas trapped in the cavity defined by the cover and the substrate increases. As a result of this concurrence, the adhesive seal may be damaged or even broken.

It is an object of the present invention to avoid this kind of damage or at least reduce the risk that such damage occurs.

To this end, the device according to the present invention is characterized in that at least one channel is provided in said interface. Such a channel allows controlled displacement of the adhesive while curing the adhesive, thus relieving the pressure on the rest of the seal.

It is preferred that a reservoir for the adhesive is present at one or both ends of the channel(s), preferably at least a capillary reservoir at the end of the channel that is farthest removed from the cavity, i.e. outside the cavity. Thus, adhesive can be supplied from the channel and from within the cavity and the displaced adhesive is captured by the outside reservoir without risking interference of the adhesive with other components of the device.

The invention also relates to a method of manufacturing a device as described above which method is characterized in that, after bringing the parts together, at least one channel is present in the interface of these parts, and in that the amount of adhesive in the channel and/or in the cavity near the channel is such that the increase of pressure resulting from said heating is at least partially relieved by displacement of the adhesive in the channel(s).

The invention will now be further explained with reference to the drawings in which two embodiments of the device according to the present invention are schematically shown.

Figure 1:
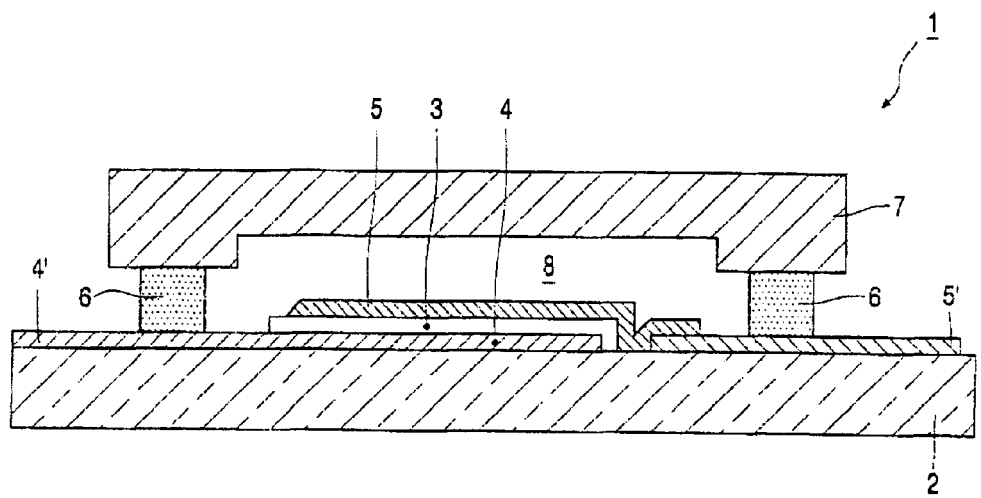
FIG. 1 is a cross-section of a device in which the present invention can be applied.

FIG. 1 shows an electroluminescent (EL) display device 1, comprising a glass substrate 2 on which several layers have been deposited by means of processes which are generally known in the art, such as physical or chemical vapor deposition. The device 1 comprises an active or emissive layer 3 comprising an organic electro-luminescent material, such as a coumarin, or a conjugated polymer like PPV (poly(P-phenylene vinylene)) or a PPV-derivative, sandwiched between two patterns of electrode layers of an electrically conductive material. In this example, the electrode layers comprise column or data electrodes 4, which are deposited directly onto the glass substrate 2, and row or selection electrodes 5, thus forming a matrix of light-emitting diodes (LEDs). At least electrode layer 4 is made of a material, such as indium tin oxide (ITO), which is transparent to the light emitted by the active layer 3. During operation, the column electrodes 4 are driven in such a way that they are at a sufficiently high positive voltage relative to the row electrodes 5, to inject holes in the active layer 3.

After depositing the electrodes 4, 5 and the active layer 3, a pattern of a thermosetting adhesive 6, such as a two-component epoxy resin, is plotted onto the glass substrate 2 and across electrically conductive tracks 4' and 5'. The shape of the pattern of the plotted adhesive is substantially equal to the shape of the interface, such as a lower rim, of a cover, in this case a pre-formed lid 7 of a metal sheet material, with which the assembly is to be hermetically sealed. The traces 4' and 5' provide an electric connection to pads outside the perimeter of the lid 7.

After placing the lid 7, which in this particular example has a rectangular shape, in general register with and on top of the plotted adhesive 6, the adhesive 6 is cured by elevating the temperature of the entire assembly. Typically, the temperature is raised from room temperature, i.e. approximately 25° C., to a temperature of 80° C. As a result of this increase in temperature, the pressure of the gas trapped in the cavity 8 defined by the substrate 2 and the cover 7 also increases, thus exerting considerable forces on the seal. At the outset of the curing process, the adhesive in the seal still has a low viscosity. Accordingly, the seal is still rather vulnerable and may be damaged by said forces.

Figure 2:
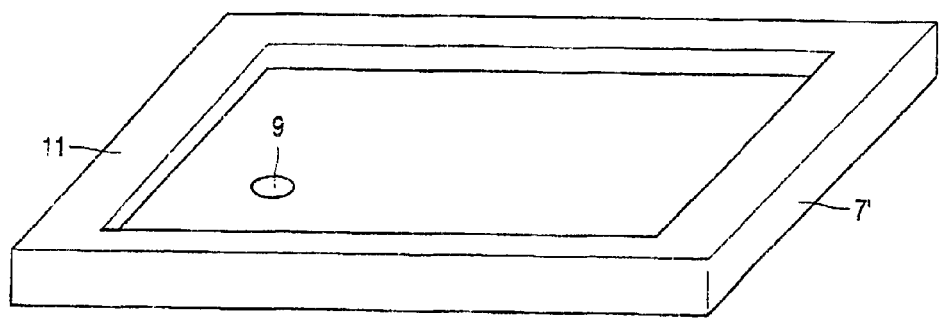
FIG. 2 shows a cover in accordance with the state of the art which is commonly used in devices of the kind shown in FIG. 1.

This problem could be suppressed by providing a hole 9 in the lid 7' as shown in FIG. 2, which serves to equalize the pressure inside and outside the cavity 8. However, such a hole 9 has to be sealed in a separate and additional process step and the resulting seal remains a potentially weak spot in the finished product.

Figure 3:
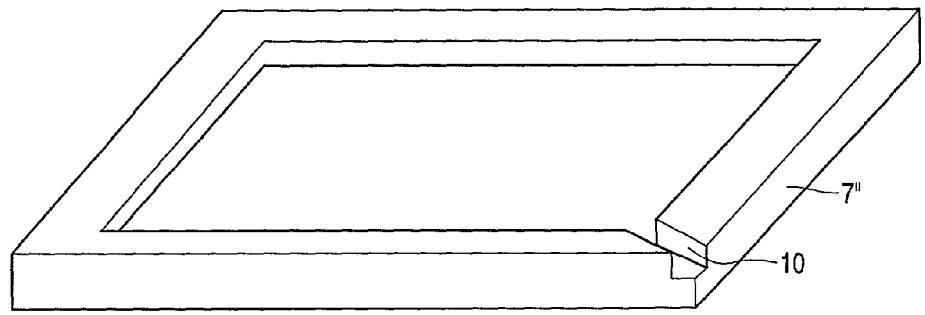
FIGS. 3, 4 and 5 show three embodiments of a cover in accordance with the present invention.
Figure 4:
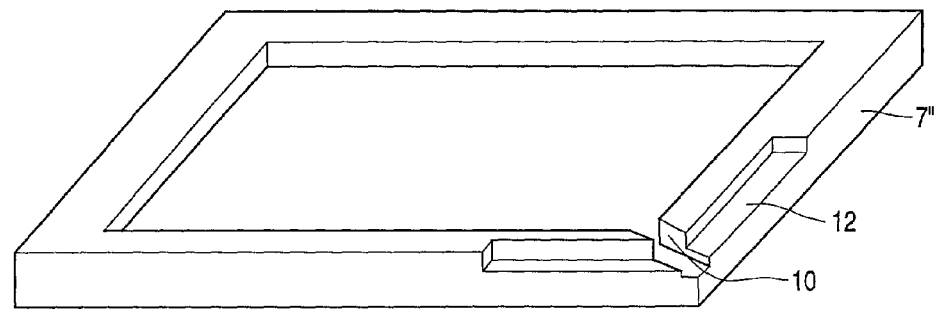
Figure 5:
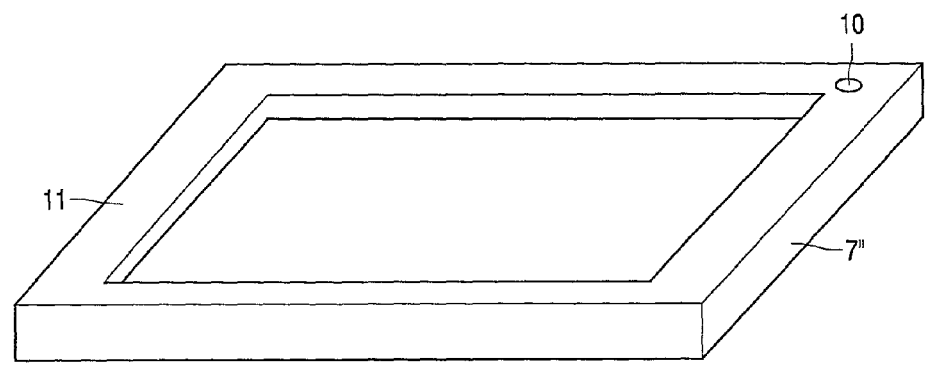

FIGS. 3, 4 and 5 show three embodiments of a lid 7" in accordance with the present invention. The interface or rim 11 of the lid 7" in FIG. 3 is provided with a channel 10 in one of its four corners. The channel 10 may be provided in the plane of the rim 11 as depicted in FIGS. 3 and 4, or may be provided through to the lid 7" having an opening in the plane of the rim 11. Once the adhesive 6 has been plotted onto the substrate 2 and/or onto the rim 11 into the channel 10 of the lid 7", the lid 7" is placed over the EL element, thus defining the cavity and forming an uncured seal. The seal is subsequently cured by heating the assembly to a temperature at which the components in the adhesive begin the react (cross-link).

Figure 6:
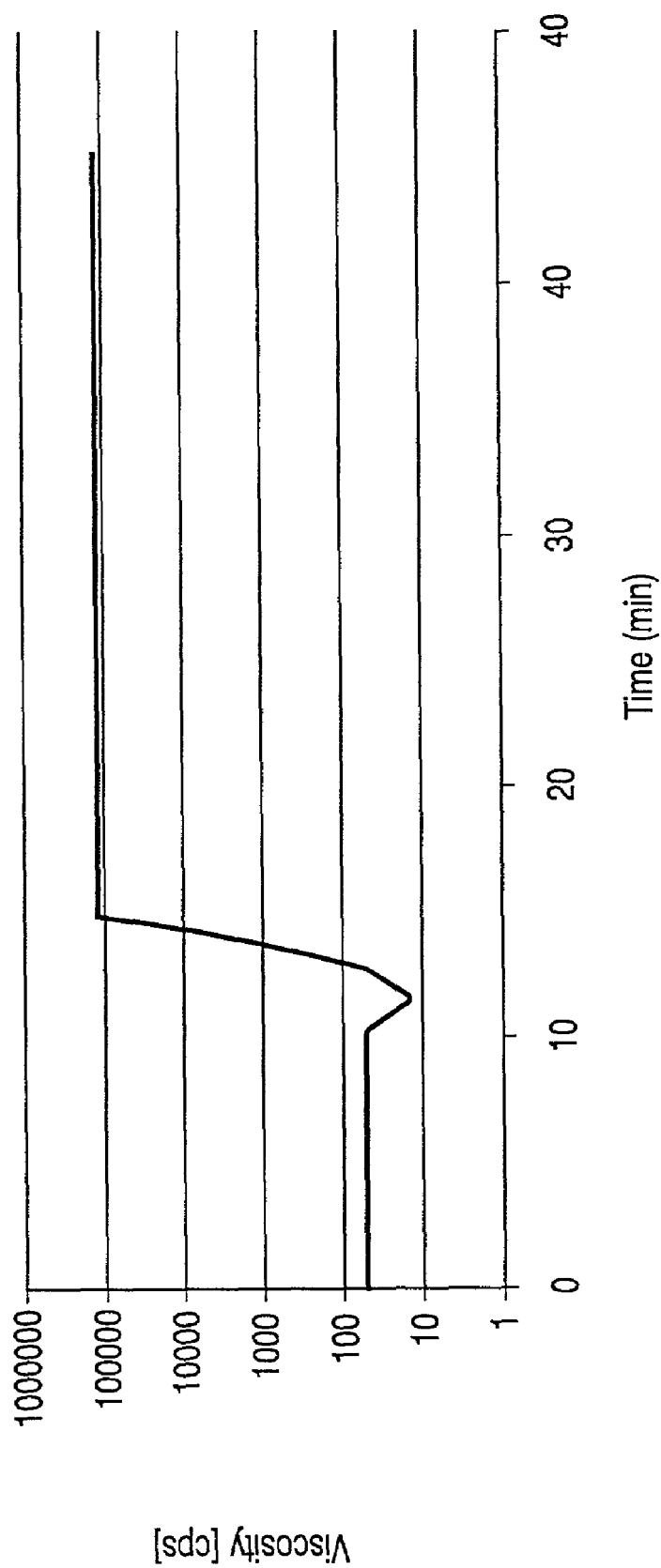
FIG. 6 shows the typical changes in the viscosity of a thermosetting adhesive while curing.

FIG. 6 shows an example of typical changes in the viscosity of a thermosetting adhesive when the temperature is raised from room temperature, i.e. approximately 25° C. at time t=10 minutes to a temperature of 80° C. As in most liquid materials, the viscosity initially drops as a result of the increased temperature (e.g., t=10 min to t≅12 min). Once the cross-linking of the components starts, the viscosity of the adhesive gradually increases until the curing is completed (e.g., t≅12 min to t≅15 min).

The present invention utilizes this behavior of the adhesive: when the adhesive is still in a liquid phase, it can be easily displaced in the channel 10 which connects the cavity to the outside environment. Thus the gas inside the cavity 8 is allowed to expand and an effective pressure relief for the rest of the seal is provided. By the time the adhesive begins to cure, the temperature and hence the pressure of said gas will substantially not increase any further, or at least not to such an extent that the integrity of the seal is at risk, and pressure relief is no longer required. When the obtained device cools down, the pressure in the cavity will drop e.g. to a level which is substantially equal to atmospheric pressure or, depending on the dimensions of the cavity and the channel(s), a sub-atmospheric pressure. In the latter case, the strength of the seal is enhanced even further.

It is preferred that an additional amount of adhesive is applied at or near the end of the channel(s) nearest the cavity. In that case, the corner of the lid 7" where the channel 10 is located effectively serves as a supply reservoir.

A (receiving) reservoir for the adhesive is preferably present at the other end of the channel. FIG. 4 shows a reservoir essentially consisting of two elongated recesses 12 adjacent the end of the channel 10 that is farthest remote from the cavity 8. During expansion of the gas inside the cavity 8, the adhesive present in the cavity 8 and the channel 10 is pushed outwards and captured by the capillary recesses formed by the elongated recesses 12 and the top surface of the glass substrate 2.

Pressure relief is further enhanced if the device comprises two or more channels, for instance, one in each corner of the lid 7". It is preferred that the volume of the channel(s) or, if one or more reservoirs are present, the combined volume of the channel(s) and the reservoir(s), is substantially equal to or larger than the difference of the volume of the gas contained in the cavity at the operating temperature of the device and the volume of said gas at the curing temperature of the adhesive.

A getter may be present in the cavity, e.g. attached to the internal surface of the lid. The lid may be shaped in such a way as to reduce the volume of the cavity and hence the ability of the gas in the cavity to expand.

As a matter of course, the channel(s) can be provided in the substrate, e.g. by means of etching, instead of or in addition to the channel(s) in the lid or other parts defining the cavity. Moreover, it is not necessary that the channel (or channels) bridges the entire interface. Instead, the channel may, for instance, extend upwardly through the edge and the upper surface of the lid, provided that such a channel remains in fluid communication with the adhesive in the seal whilst curing. Also, the lid may have other shapes, e.g. octagonal or oval, and may be made of a transparent material, e.g. when the lid covers (one of) the display side(s) of the EL element.

The invention is not limited to the embodiments described above and can be varied in a number of ways within the scope of the claims. For instance, although the above description is primarily directed towards EL devices, the invention can be applied in other devices where the increase of pressure of internal or trapped gases during the thermosetting of an adhesive in a seal may cause damage to that seal.

In summary, the invention relates to a device, particularly an electroluminescent display device, comprising two or more parts which define a cavity for accommodating one ore more components, such as an electroluminescent element, and which are sealed together by means of a thermosetting adhesive present at the interface of the two or more parts. At least one channel is provided in said interface.

The invention claimed is:

1. A device, comprising two or more parts (2,7) which define a cavity (8) for accommodating one or more elements (3,4,5), and which are sealed together by means of a thermosetting adhesive (6) present at the interface (11) of the two or more parts (2,7), characterized in that at least one channel (10) is provided in said interface (11) wherein the channel (10) is open to the cavity (8) to provide a pressure relief for the thermosetting adhesive (6) during manufacture of the device.

2. The device as claimed in claim 1, wherein a reservoir for the adhesive (6) is present at one or both ends of the channel (10).

3. The device claimed in claim 2, wherein said reservoir comprises a capillary reservoir (12) which is located at the end of the channel (10) that is outside the cavity (8).

4. The device as claimed in claim 2, wherein one of the parts comprises a substantially flat substrate (2) on which the electroluminescent element (3,4,5) is deposited and a preformed cover (7") of a sheet material, which is shaped to define part of the cavity (8), the channel (10) and, optionally, the reservoir.

5. The device as claimed in claim 1, wherein one of the parts (2,7") has a substantially polygonal, interface (11) with the channel (10) being located in one of the corners of the polygonal interface (11).

6. The device as claimed in claim 1, wherein the channel (10) allows the thermosetting adhesive (6) present at the interface (11) to flow into the channel (10) in response to pressure from the cavity (8) during manufacturing of the device.

7. An electroluminescent display device (1) comprising:
a plurality of parts (2,7) joined together at an interface (11) and sealed together with a thermosetting adhesive (6) present at the interface (11);
a cavity (8) defined inside the parts (2,7);
at least one electroluminescent element (3,4,5) within the cavity (8), and
at least one channel (10) formed of one of the parts (2,7) and provided at the interface (11) with respect to the cavity such that that the channel is open to the cavity (8) and allows pressure inside the cavity (8) to escape into the channel during manufacturing of the device.

8. A device as claimed in claim 7, wherein a reservoir for the adhesive (6) is present in at least one end of the channel (10).

9. A device as claimed in claim 8, wherein said reservoir comprises a capillary reservoir (12) which is located at the end of the channel (10) outside the cavity (8).

10. A device as claimed in claim 7, wherein at least one of the parts (2,7") has a substantially polygonal interface (11) with the channel (10) being located in at least one corner of the polygonal interfere (11).

11. A device as claimed in claim 7, wherein one of the parts comprises a substantially flat substrate (2) having the electroluminescent element (3,4,5) deposited and a pre-formed cover (7") of a sheet material, which is shaped to define part of the cavity (8).

12. A device as claimed in claim 7 wherein the channel (10) allows pressure inside the cavity (8) to force a portion of the thermosetting adhesive (6) into the channel (10) during heating that occurs in manufacturing process of the device.

13. A device as claimed in claim 12 wherein the channel (10) becomes sealed by the portion of the thermosetting adhesive (6) forced into the channel (10) during heating that occurs in manufacturing process of the device.

14. A device as claimed in claim 12 wherein the channel (10) allows pressure inside the cavity (8) will force a portion of the thermosetting adhesive (6) into the channel (10) during heating that occurs in manufacturing process of the device for a predetermining range of viscosities of the thermosetting adhesive (6).

15. A device as claimed in claim 7, wherein the channel (10) provides a pressure relief for the thermosetting adhesive (6) during manufacturing of the device.

16. A device as claimed in claim 7, wherein the channel (10) allows the thermosetting adhesive (6) present at the interface (11) to flow into the channel (10) in response to pressure from the cavity (8) during manufacturing of the device.

* * * * *